United States Patent
Hsieh (12)

(10) Patent No.: US 11,472,264 B2
(45) Date of Patent: Oct. 18, 2022

(54) APPARATUSES FOR CONTROLLING ENVIRONMENTAL CONDITIONS AND ASSOCIATED METHODS

(71) Applicant: Gogoro Inc., Hong Kong (CN)

(72) Inventor: Sheng-Meng Hsieh, Taipei (TW)

(73) Assignee: Gogoro Inc., Hong Kong (CN)

( * ) Notice: Subject to any disclaimer, the term of this patent is extended or adjusted under 35 U.S.C. 154(b) by 75 days.

(21) Appl. No.: 15/914,939

(22) Filed: Mar. 7, 2018

(65) Prior Publication Data

US 2019/0275864 A1    Sep. 12, 2019

(51) Int. Cl.
  B60H 1/32    (2006.01)
  B60K 35/00   (2006.01)
  (Continued)

(52) U.S. Cl.
  CPC .............. B60H 1/32 (2013.01); B60K 35/00 (2013.01); G06F 1/1656 (2013.01); G06F 1/20 (2013.01);
  (Continued)

(58) Field of Classification Search
  CPC .... F25B 21/02; F25B 21/04; F25B 2321/002; F25B 2321/02; F25B 21/00; B60H 3/025;
  (Continued)

(56) References Cited

U.S. PATENT DOCUMENTS

| | | | | |
|---|---|---|---|---|
| 4,499,736 A | * | 2/1985 | Lieu | F24F 5/0042 |
| | | | | 62/3.4 |
| 4,586,342 A | * | 5/1986 | Morishita | F25B 21/02 |
| | | | | 62/3.4 |

(Continued)

FOREIGN PATENT DOCUMENTS

| | | | |
|---|---|---|---|
| CN | 101506590 A | 8/2009 | |
| DE | 102009008233 A1 * | 8/2010 | ........... H05K 5/0213 |

(Continued)

OTHER PUBLICATIONS

DE102009008233A1 English Machine Translation (Year: 2010).*
(Continued)

*Primary Examiner* — Jenna M Hopkins
(74) *Attorney, Agent, or Firm* — Perkins Coie LLP

(57) ABSTRACT

The present disclosure relates to apparatuses/systems and associated methods for controlling an environmental condition inside a container or housing. The apparatus includes (1) a thermoelectric cooling unit having a first side facing away from an inner surface of the housing and a second side facing the inner surface of the housing; (2) a capillary unit having a first part and a second part; and (3) a sensor positioned inside the housing and configured to sense a humidity value and a temperature value inside the housing. The first part is coupled to the thermoelectric cooling unit and is positioned inside the housing. The second part is positioned outside the housing. If the humidity value is greater than a humidity threshold and the temperature value is greater than a temperature threshold, the thermoelectric cooling unit removes moisture in the housing, and the first part of the capillary unit collects the removed moisture and transmits the removed moisture to the second part of the capillary unit.

14 Claims, 8 Drawing Sheets

(51) Int. Cl.
*G06F 1/20* (2006.01)
*G06F 1/16* (2006.01)
*H01L 25/065* (2006.01)

(52) U.S. Cl.
CPC .......... *G06F 1/206* (2013.01); *H01L 25/0655* (2013.01); *B60H 2001/3244* (2013.01); *B60H 2001/3255* (2013.01); *B60H 2001/3286* (2013.01); *B60K 2370/70* (2019.05)

(58) Field of Classification Search
CPC ............. B60H 1/00478; B60H 1/00785; F24F 5/0042; F24F 3/1405; H05K 5/0213
USPC .......................................................... 62/3.4
See application file for complete search history.

(56) References Cited

U.S. PATENT DOCUMENTS

| | | | | |
|---|---|---|---|---|
| 5,444,984 A * | 8/1995 | Carson | ................... | A47B 81/00 62/3.4 |
| 5,555,732 A * | 9/1996 | Whiticar | ................... | F24F 3/14 62/3.4 |
| 5,884,486 A * | 3/1999 | Hughes | ................... | F25B 21/02 62/279 |
| 6,089,237 A * | 7/2000 | Podolak, Jr. | ............. | A24F 25/02 131/300 |
| 6,116,029 A * | 9/2000 | Krawec | ................... | A24F 25/02 62/3.3 |
| 6,158,224 A * | 12/2000 | Hu | ............................. | F24F 3/14 62/3.4 |
| 6,250,083 B1 * | 6/2001 | Chou | ........................ | F24F 3/14 62/3.4 |
| 6,378,311 B1 * | 4/2002 | McCordic | ................. | F24F 3/14 62/3.4 |
| 6,453,679 B1 * | 9/2002 | Aoyagi | ................... | B01D 53/26 62/279 |
| 9,255,742 B2 * | 2/2016 | Yasunaga | ................ | F28D 15/00 |
| 9,528,763 B2 * | 12/2016 | Manninen | ............ | H05K 5/0213 |
| 9,851,282 B2 * | 12/2017 | Inoue | ...................... | G01N 30/16 |
| 9,857,107 B2 * | 1/2018 | Inaba | .................... | B60N 2/5692 |
| 10,156,397 B2 * | 12/2018 | Marty | ..................... | F25D 21/14 |
| 10,520,208 B2 * | 12/2019 | Lee | ........................ | F25B 21/02 |
| 10,520,230 B2 * | 12/2019 | Edwards | ................ | F25B 21/02 |
| 2002/0044411 A1 * | 4/2002 | Iredale | ................. | G06F 1/1616 361/679.05 |
| 2003/0226363 A1 * | 12/2003 | Lee | ....................... | F25D 29/008 62/3.6 |
| 2006/0005548 A1 * | 1/2006 | Ruckstuhl | .............. | A47B 77/08 62/3.2 |
| 2006/0118274 A1 * | 6/2006 | Lee | ........................ | F24F 13/30 165/58 |
| 2007/0058329 A1 * | 3/2007 | Ledbetter | .............. | G06F 1/1616 361/679.06 |
| 2007/0101602 A1 * | 5/2007 | Bae | ....................... | D06F 58/206 34/77 |
| 2007/0157628 A1 * | 7/2007 | Onoue | .................... | F25B 21/02 62/3.2 |
| 2007/0228232 A1 * | 10/2007 | Ikeno | ..................... | F16M 11/10 248/157 |
| 2010/0050659 A1 * | 3/2010 | Quisenberry | ...... | B60H 1/00478 62/3.61 |
| 2010/0107656 A1 * | 5/2010 | Nakaguro | ................ | B60H 3/02 62/3.4 |
| 2010/0274396 A1 * | 10/2010 | Yang | .................. | B60H 1/00385 700/278 |
| 2011/0030388 A1 * | 2/2011 | Johansson | ................. | F24F 3/14 62/3.4 |
| 2012/0117983 A1 * | 5/2012 | Akiyama | ........... | B60H 1/00478 62/3.4 |
| 2012/0174599 A1 * | 7/2012 | Barnwell | ............. | B01D 53/265 62/3.3 |
| 2012/0304667 A1 * | 12/2012 | Shin | ........................ | F25B 21/02 62/3.6 |
| 2014/0250938 A1 * | 9/2014 | Tanaka | .................... | F25B 21/02 62/303 |
| 2015/0075184 A1 * | 3/2015 | Edwards | .................. | F25B 21/02 62/3.2 |
| 2015/0165955 A1 * | 6/2015 | Oh | ......................... | B60N 3/104 62/3.4 |
| 2015/0233611 A1 * | 8/2015 | Jung | ......................... | F25B 21/02 62/3.4 |
| 2016/0042932 A1 * | 2/2016 | Hannigan | ........... | H01J 49/0463 250/282 |
| 2016/0137036 A1 * | 5/2016 | Oh | ...................... | B60H 1/00478 62/3.4 |
| 2016/0150683 A1 * | 5/2016 | Sagerian | ................... | G06F 1/20 361/714 |
| 2016/0161998 A1 * | 6/2016 | Kinstle, III | ............... | G06F 1/20 62/3.2 |
| 2017/0176061 A1 * | 6/2017 | Moran | .................... | H02S 10/40 |
| 2017/0276384 A1 * | 9/2017 | Yuan | ........................ | F24F 11/30 |
| 2018/0094823 A1 * | 4/2018 | Lee | ........................... | F24F 3/153 |
| 2018/0206550 A1 * | 7/2018 | Greppin | .................. | A24F 25/02 |

FOREIGN PATENT DOCUMENTS

| | | | | |
|---|---|---|---|---|
| DE | 102009008233 A1 | | 8/2010 | |
| EP | 3124881 A1 * | | 2/2017 | ............ B60H 3/024 |

OTHER PUBLICATIONS

Thermo Hygrometers—PCE Instruments (Nov. 23, 2011) (Year: 2011).*
Effects of display position of a visual in-vehicle task . . . —Wittman (Jul. 2006) (Year: 2006).*
Statement of Principles,Criteria, and Verification Procedures . . . —Auto Alliance (Jun. 2006)) (Year: 2006).*
European Search Report received for European Application No. EP19160003.0, Applicant Gogoro Inc., dated Jul. 30, 2019, 4 pages.
Chinese Office Action received for co-pending Chinese Patent Application No. CN201910168229.9; Applicant; Gogoro Inc.; dated Sep. 2, 2020, 9 pages.

* cited by examiner

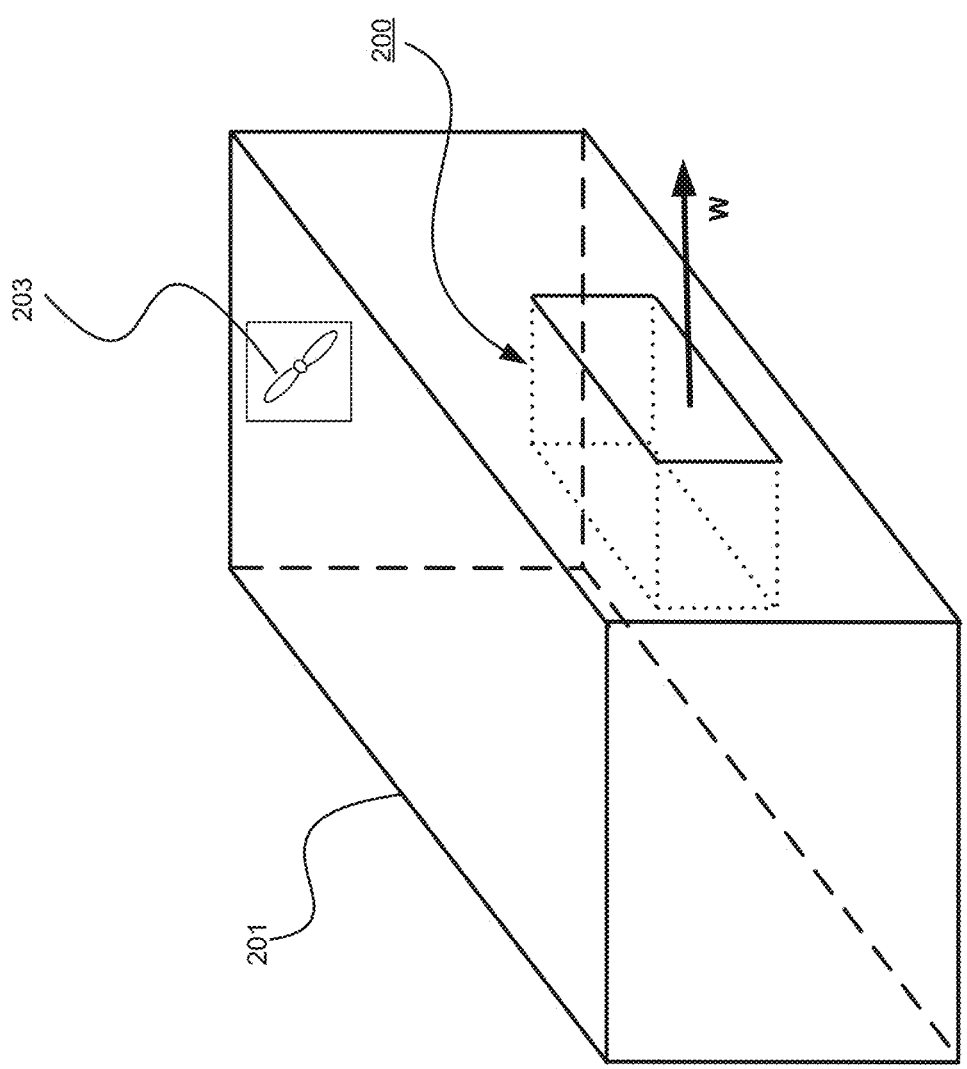

| Dew point temperature (°C) | Relative humidity (RH) |
|---|---|
| 6 | 39.99 |
| 7 | 42.84 |
| 8 | 45.87 |
| 9 | 49.09 |
| 10 | 52.51 |
| 11 | 56.13 |
| 12 | 59.97 |
| 13 | 64.05 |
| 14 | 68.36 |
| 15 | 72.92 |
| 16 | 77.75 |
| 17 | 82.86 |
| 18 | 88.26 |
| 19 | 93.97 |
| 20 | 100 |

*FIG. 5*

APPARATUSES FOR CONTROLLING ENVIRONMENTAL CONDITIONS AND ASSOCIATED METHODS

TECHNICAL FIELD

The present disclosure generally relates to an apparatus or a device for adjusting environmental conditions in a container or housing. More particularly, the present disclosure relates to an apparatus for adjusting humidity and/or temperature inside a container configured to accommodate an electronic component that is sensitive to humidity and/or temperature. For example, the electronic component can be a display component positioned in a dashboard container of a vehicle.

BACKGROUND

Some components or devices are sensitive to environmental conditions and can be operated normally only in a controlled environment. For example, an electronic component can only be operated under certain humidity. When the humidity is too high, a short circuit may occur and then cause damages to the electronic component. Traditionally, a coating can be applied to the electronic component so as to protect it from outside moisture. However, the coating can be expensive and difficult to maintain (e.g., leakage may occur from time to time). Another traditional way is to use an absorbent to absorb excessive moisture around the electronic component. This method, however, requires periodical replacement of the absorbent, which can be inconvenient. In addition, sometime the moisture absorbent itself can become a source of moisture, if it not properly replaced or maintained. Therefore, it is advantageous to have an improved apparatus, system, and method to address the foregoing problem.

BRIEF DESCRIPTION OF THE DRAWINGS

FIG. 2B is a schematic diagram illustrating the apparatus in accordance with embodiments of the present disclosure.

FIG. 5 is a reference table showing the relationship between dew point temperature and relative humidity.

DETAILED DESCRIPTION

Figure 1A:
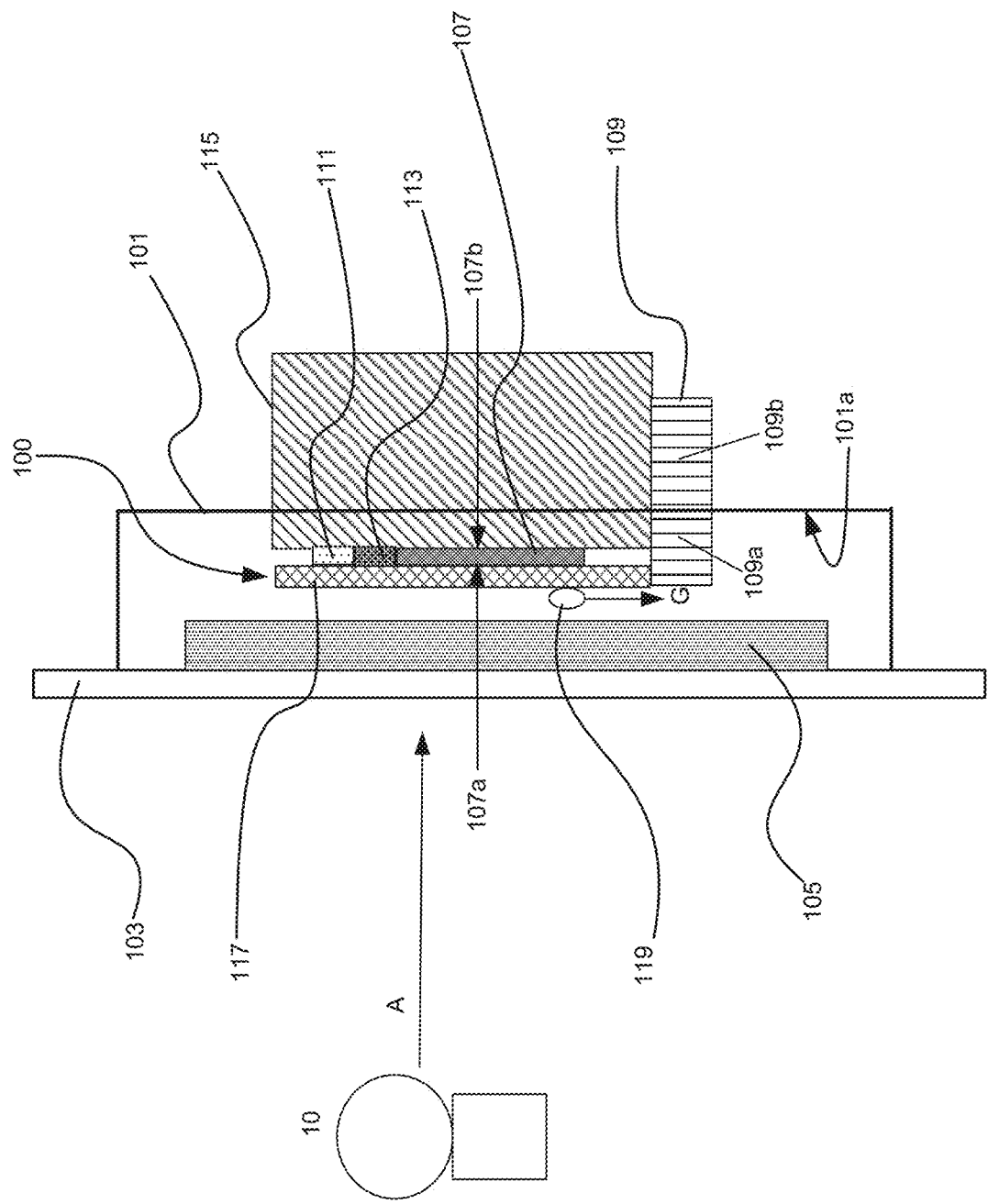
FIG. 1A is a schematic diagram illustrating an apparatus in accordance with embodiments of the present disclosure.

The present disclosure is directed to an apparatus for controlling an environmental condition (e.g., humidity, temperature, pressure, etc.) inside a housing (e.g., a dashboard display housing that houses a liquid crystal display or a light-emitting-diode display). The apparatus includes (1) a thermoelectric cooling (TEC) unit positioned at least partially inside the housing; (2) a capillary unit coupled to the TEC unit and configured to collect and transfer moisture therefrom; (3) a sensor positioned inside the housing and configured to sense/measure an environmental value (e.g., a humidity value, a temperature value, etc.) inside the housing; and (4) a controller (e.g., a processor, an engine control unit, ECU, etc.) coupled to the sensor and the TEC unit and configured to adjust the environment condition inside the housing by controlling the TEC unit. The TEC unit is configured to collect moisture in the housing (e.g., by lowing its temperature such that the moisture in the housing condenses and transforms into liquid thereon). The housing is configured to accommodate (e.g., to hold, support, surround, enclose, etc.) and protect (e.g., against physical impact from the outside or from an electromagnetic field that can interfere with the function of the display) a display component positioned therein such that the display component can function properly and be viewed by a user. In some embodiments, the user can view the display component from one side of the housing, and the TEC unit can be positioned at another side (e.g., the side opposite or adjacent to the display component) of the housing. In some embodiments, the TEC unit can be positioned inside the housing. In some embodiments, a portion of the TEC unit can be positioned outside the housing.

In some embodiments, the capillary unit includes a first part and a second part, which can be defined by the housing. For example, the first part is positioned inside the housing and is coupled to the TEC unit (directly or indirectly). The first part can collect or absorb liquid collected by the TEC unit. The second part is positioned outside the housing and is configured to transfer the collected liquid transferred from the first part. In some embodiments, the first part and the second part can be integrally formed. In some embodiments, the capillary unit can be made of an elastic material such that it can maintain an airtight condition in the housing.

The sensor positioned inside the housing measures an environmental value (e.g., a humidity value, a temperature value, etc.) inside the housing and then transmits the measured value(s) to the controller. Once the controller receives the measured value(s) from the sensor, the controller can actively control the environment inside the housing based on a set of predetermined rules. For example, in some embodiments, if the humidity value is greater than a humidity threshold and the temperature value is greater than a temperature threshold, the controller can instruct the TEC unit to start to remove moisture inside the housing (e.g., by condensation). The first part of the capillary unit then collects the removed moisture (e.g., liquid) and transmits the removed moisture to the second part of the capillary unit (which is positioned outside the housing).

In some embodiments, the apparatus can include a heat sink or heat conductor coupled to the TEC unit and the second part of the capillary unit. By this arrangement, the heat sink can use the heat from the TEC unit to evaporate the removed moisture, and accordingly enhance the overall moisture-removal efficiency of the apparatus.

The present disclosure also provides a method for controlling humidity inside a container (or, a housing, a support structure, etc.) configured to accommodate a display (e.g., a dashboard LED/LCD display). The method includes, inter alia, (1) sensing a humidity value and a temperature value inside the container; (2) analyzing the humidity value based on a humidity threshold (e.g., about 50% relative humidity); and (3) analyzing the temperature value based on a temperature threshold (e.g., about 7 degrees Celsius). The present method provides a quick and convenient way to control the humidity in the container by dividing the measured humidity and temperature into four categories. In some embodiments, the present technology enables an operator to set up various thresholds or criteria based on multiple factors such as operating environments, vehicle types, display types, sizes/dimensions of the display/container, etc. In some embodiments, the present technology provides recommendations regarding threshold values to a user based on prior histories (e.g., metrological data) or user behavior (e.g., driving routes, driving habits, etc.).

High-Temperature-High-Humidity Situation

In some embodiments, if the sensed humidity value is greater than the relative humidity threshold (e.g., greater than 50% relative humidity) and the temperature value is greater than the temperature threshold (e.g., greater than 25 degrees Celsius), the present technology can instruct a TEC unit coupled to the container to remove, at least partially, moisture in the container. In such situation, without be bound by theory, because the sensed temperature and humidity are both high, it would be better to initiate a moisture removal process immediately (e.g., by setting a target temperature of the TEC unit as 7 degrees Celsius) such that to the display in the container can function properly. The TEC unit includes a first side facing the display and a second side facing away the display. The first side of the TEC unit is a cooling side and the other side of the TEC unit is a heating side. During the moisture removal process, the first side of the TEC unit removes the moisture in the container by condensation.

The TEC unit is further coupled to a capillary unit (e.g., made of diatomite, ceramic, kieselguhr, moisture absorbing materials, or other suitable materials). The capillary unit includes a first part positioned inside the container and a second part positioned outside the container. The first part is coupled to the TEC unit and is configured to collect the removed moisture. The removed moisture is then transmitted to the second part and is drained (or evaporated) out from the container.

Low-Temperature-High-Humidity Situation

In some embodiments, if the sensed humidity value is greater than the relative humidify threshold (e.g., greater than 50% relative humidity) and the temperature value is smaller than the temperature threshold (e.g., smaller than 25 degrees Celsius), the present technology can set the target temperature of the TEC unit as 25 degrees Celsius. In such situation, without be bound by theory, when the sensed temperature is low whereas the sensed humidity is high, it is easy for the moisture in the air to condense on a surface of a display, thereby causing a "foggy" or "blurry" display. Accordingly, the present technology can instruct the TEC unit to increase the temperature to mitigate this foggy display situation.

High-Temperature-Low-Humidity Situation

When the Sensed humidity value is smaller than the relative humidity threshold (e.g., smaller than 50% relative humidity) and the temperature value is greater than the temperature threshold (e.g., greater than 25 degrees Celsius), the present technology can set the target temperature of the TEC unit as 25 degrees Celsius. In such situation, without be bound by theory, when the sensed temperature is high whereas the sensed humidity is low, it is easy for the moisture in the air to condense on a surface of a display, which may also result in the foggy display situation. Therefore, the present technology will instruct the TEC unit to decrease the temperature to mitigate this foggy display situation. In this situation, the target temperature can be set as 25 degree Celsius, rather than 7 degrees Celsius, is because the sensed humidity is low and therefore setting the target temperature of the TEC unit is sufficient to handle current excessive moisture. As a result, there is no need to set the target temperature of the TEC as low as the high-temperature-high-humidity situation discussed above.

Low-Temperature-Low-Humidity Situation

In some events where the sensed humidity value is smaller than the relative humidity threshold (e.g., smaller than 50% relative humidity) and the temperature value is smaller than the temperature threshold (e.g., smaller than 25 degrees Celsius), the present technology can set the target temperature of the TEC unit as 25 degrees Celsius. In such situation, without be bound by theory, when the sensed temperature is low whereas the sensed humidity is low, it is relatively difficult to have the foggy display situation described above. However, to maintain a proper temperature for the components of the vehicle to operate normally, the present technology will instruct the TEC unit to increase the temperature to 25 degrees Celsius (e.g., room temperature). Note that the relative humidity value and the temperature value discussed above are only examples and can vary in other embodiments.

Embodiments showing the features and advantages of this disclosure will be expounded in following paragraphs of descriptions. It is to be realized that the present technology can have various modifications in different respects, all of which are without departing from the scope of the present technology, and the descriptions herein and the drawings are to be taken as illustrative in nature, but not to be taken as a limitation for the embodiments.

FIG. 1A is a schematic diagram illustrating an apparatus 100 in accordance with embodiments of the present disclosure. As shown in FIG. 1A, the apparatus 100 is positioned inside a housing 101. The housing 101 is coupled to a cover 103. The housing 101 and the cover 103 together form an enclosed container to accommodate an electronic component such as a display component 105. In the illustrated embodiments, the cover 103 is made of a transparent material (e.g., plastic, resin, glass, etc.) such that a user 10 can observe the display component 105 in direction A. As also shown, the display component 105 is positioned adjacent to the cover 103. In some embodiments, the container can be positioned in a dashboard of a vehicle and the display component 105 can visually present vehicle information to a driver or a rider.

In the illustrated embodiments, the apparatus 100 includes a thermoelectric cooling unit (TEC unit) 107, a capillary unit 109, a sensor 111, and a controller 113. The TEC unit 107 is configured to release or absorb heat (e.g., heating or cooling) when an electric current passes therethrough. In some embodiments, the TEC unit 107 can include two different types of materials that can generate/absorb heat based on Peltier effect or Thomson effect. In some embodiments, the TEC unit 107 can include a cooling chip set, a Peltier device, a Thomson device, a solid-state refrigerator, and/or other suitable components. In some embodiments, the TEC unit 107 can include multiple N-type and P-type semiconductor components.

As shown in FIG. 1A, the TEC unit 107 has a first side 107a facing the display component 105 and a second side 12 facing an inner surface 101a of the housing 101. As shown, the inner surface 101a is opposite to the display component 105 and the cover 103. In other words, the first side 107a faces away from the inner surface 101a and the second side 107b faces the inner surface 101a. In some embodiments, the first side 107a is a cooling side (or cold side) of the TEC unit 107 and the second side 107b is a heating side (or hot side) of the TEC unit 107. In the illustrated embodiments, the heating side is positioned opposite to the cooling side and both sides are in substantial parallel. In other embodiments, however, the first and second sides 1074a, 107b can have other configurations (e.g., adjacent to each other). When a moisture removal process is initiated, the temperature of the first side 107a of the TEC unit 107 decreases, causing the moisture near the first side 107a to be condensed into liquid water. At the same time, the temperature of the second side 107b of the TEC unit 107 increases and accordingly can heat a heat sink 115 coupled thereto. The heat sink 115 can be used to facilitate evaporating collected moisture in the capillary unit 109 (to be discussed in detail below).

The capillary unit 109 includes a first part 109a and a second part 109b. In some embodiments, the first part 109a and the second part 109b are integrally formed by a moisture absorbent material (e.g., ceramic, kieselguhr, diatomite, etc.). In the illustrated embodiments, the first part 109a is coupled to the first side 107a of the TEC unit 107 through a moisture collecting structure 117. The moisture collecting structure 117 is positioned to facilitate a collected water drop 119 to move toward the first part 109a of the capillary unit 109 in direction G (e.g., moved by gravity). The first part 109a of the capillary unit 109 is positioned inside the housing 101, and the second part 109b of the capillary unit 109 is positioned outside the housing 101. In some embodiments, the first part 109a is configured to receive the collected moisture and then transfer it to the second part 109b. As shown, the second part 109b of the capillary unit 109 is further coupled to the heat sink 115 such that the heat therefrom can facilitate the second part 109b of the capillary unit 109 to evaporate the collected moisture. By this arrangement, the apparatus 100 can effectively remove the moisture inside the housing 101 and accordingly control the humidity therein.

As shown in FIG. 1A, the sensor 111 is positioned inside the housing 101 and is configured to sense a relative humidity value and a temperature value inside the housing 101. In some embodiments, the sensor 111 can include multiple sensors, which can measure various environmental conditions (e.g., temperature, humidity, air pressure, brightness, air quality, etc.). In some embodiments, the sensor 111 can include a transducer that converts measured information into signals in electrical form. In other embodiments, the sensor 111 can be positioned at other locations in the housing 101 (e.g., on a side of the housing 101, on the inner surface 101a, adjacent to the display component 105, etc.).

In the illustrated embodiments, the controller 113 is coupled to the sensor 111 and the TEC unit 107. The controller 113 is configured to control and communicate with other components, including receiving signals regarding the humidity value and the temperature value measured by the sensor 111. In some embodiments, the controller 113 can compare the measured humidity value with a humidity threshold. The controller 113 can also compare the measured temperature value with a temperature threshold. Based on the comparison, the controller 113 can control the TEC unit 107 accordingly. In some embodiments, the controller 113 can be a remote controller positioned away from other elements of the apparatus 100. For example, the controller 113 can be a vehicle controller (e.g., an engine control unit, ECU) located away from the TEC unit 107 (e.g., embodiments discussed below with reference to FIG. 6). In such embodiments, the controller 113 can control the TEC unit 107 via a wired or wireless communication.

For example, when the measured humidity value is greater than the relative humidity threshold and the measured temperature value is greater than the temperature threshold, the controller 113 can instruct the TEC unit 107 to convert moisture in the housing 101 into liquid water by condensation. Then the first part 109a of the capillary unit 109 collects the condensed moisture and transmits it to the second part 109b of the capillary unit 109. In some embodiments, the controller 113 can instruct the TEC unit 107 to control the humidity and the temperature in the housing 101 based on various user settings and/or configurations.

In some embodiments, the surface of the moisture collecting structure 117 can include a metal coating or other suitable layers. In such embodiments, the metal coating can reduce the surface tension of the collected water drop 119, and thereby facilitating the collected water drop 119 to move toward the capillary unit 109. In some embodiments, the apparatus 100 can be implemented without the moisture collecting structure 117. In such embodiments, the first side 107a of the TEC unit 107 can be used to condense the collected water drop 119 and transmit it to the capillary unit 109. In such embodiments, the TEC unit 107 can be directly coupled to the capillary unit 109. In some embodiments, the first side 107a of the TEC unit 107 can have a metal coating (or other suitable coatings, layers, surfaces, etc.) that reduces the surface tension of the of the collected water drop 119.

Figure 1C:
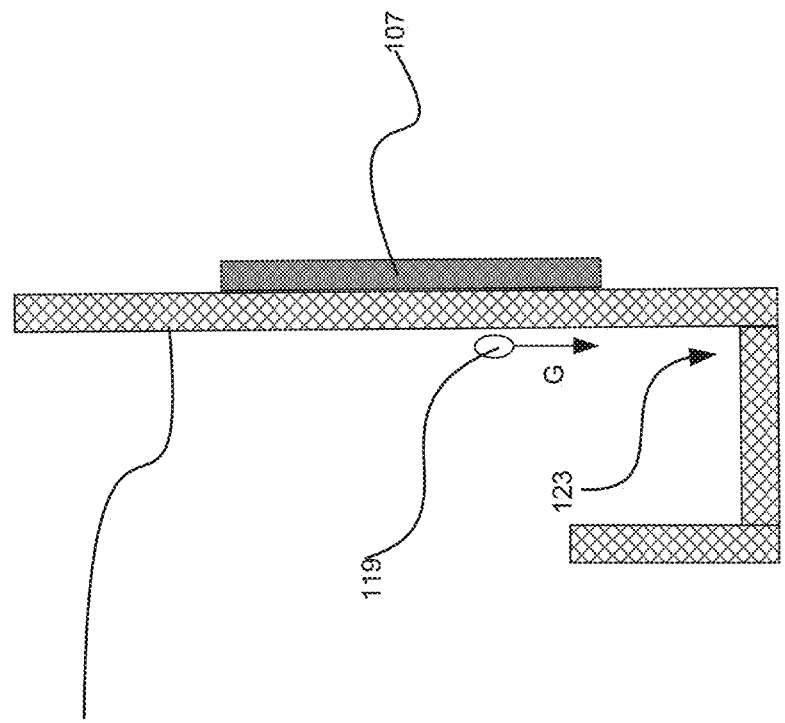
FIG. 1C is a schematic diagram illustrating another moisture collecting structure in accordance with embodiments of the present disclosure.
Figure 1B:
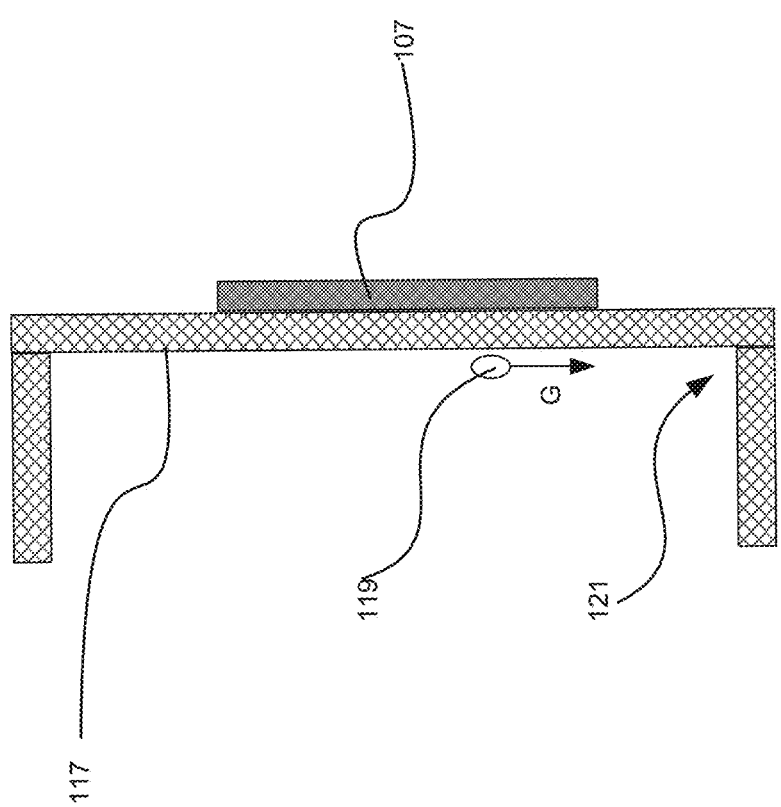
FIG. 1B is a schematic diagram illustrating a moisture collecting structure in accordance with embodiments of the present disclosure.

In some embodiments, the moisture collecting structure 117 can be a U-shaped structure, as shown in FIG. 1B. In such embodiments, the moisture collecting structure 117 can be formed with a corner 121 for temporarily accommodating the collected water drop 119. The collected water drop 119 can then be drained out from the corner 121 and be moved out of the housing 101. In some embodiments, the moisture collecting structure 117 can be a J-shaped structure, as shown in FIG. 1C. In such embodiments, the moisture collecting structure 117 can be formed with a pocket 123 for temporarily accommodating the collected water drop 119. The collected water drop 119 can then be drained out from the pocket 123 and then be moved out of the housing 101. In some embodiments, the capillary unit 109 can be positioned at one or both sides of the pocket 123 to absorb water in the pocket 123 and then transfer it out of the pocket 123. In some embodiments, the moisture collecting structure 117 can include a "sloped" bottom structure (e.g., a center portion thereof is higher than side portions thereof) to facilitate directing collected water to the sides (which can then be absorbed and transferred by the capillary unit 109). In some embodiments, the pocket 123 can include a layer of water absorbent (e.g., positioned on its sidewall) and configured to absorb at least a portion of the collected water in the pocket 123. The water absorbent can reduce possible water spills when the moisture collecting structure 117 is moved or vibrated.

In some embodiments, the surface of the moisture collecting structure 117 (or the TEC unit 107) can be processed (e.g., to add a coating layer) such that the collected water drop 119 can be accumulated or moved easily. In some embodiments, the shape of the moisture collecting structure 117 (or the TEC unit 107) can be formed (e.g., to add a coating layer) such that the collected water drop 119 can be accumulated easily. For example, the moisture collecting structure 117 can have a wider upper portion and a narrower lower portion. In such embodiments, the collected water drop 119 can move downwardly from the wider upper portion to the narrower lower portion and grow. As the collected water drop 119 grows into a larger one, it becomes easier to be collected and removed from the housing 101. In some embodiments, the moisture collecting structure 117 can include a "funnel" structure such that the collected water drops 119 can be collected and directed by the funnel structure. The capillary unit 109 can be coupled to the funnel structure (e.g., to a bottom portion of the funnel structure) to further direct the collected water. In such embodiments, the size and the shape of the capillary unit 109 coupled to the moisture collecting structure 117 can be adjusted accordingly. For example, the capillary unit 109 can be shaped in accordance with the funnel structure to facilitate directing collected water drops 119. As a result, for example, the size of the capillary unit 109 can be reduced and accordingly the manufacturing cost is lowered.

In some embodiments, the first part 109*a* of the capillary unit 109 can be directly coupled to the first side 107*a* of the TEC unit 107 and the second part 109*b* of the capillary unit 109 can be directly coupled to the second side 107*b* of the TEC unit 107. In such embodiments, the TEC unit 107 can directly transfer heat to and absorb heat from the capillary unit 109. In some embodiments, the first and second parts 109*a*, 109*b* of the capillary unit 109 can be positioned to keep a distance between the capillary unit 109 and the TEC unit 107. The distance can be determined based on various factors such as the types of the TEC unit 107 and the capillary unit 109, the dimension of the housing 101, and/or other suitable design factors.

In some embodiments, the apparatus 100 can be positioned in an enclosure, a chamber, or a confined space that requires an environment control for proper operations. The container (e.g., a dashboard container) formed by the housing 101 and the cover 103 in FIG. 1A is only an example but in no way limits the applications of the present technology.

Figure 2A:
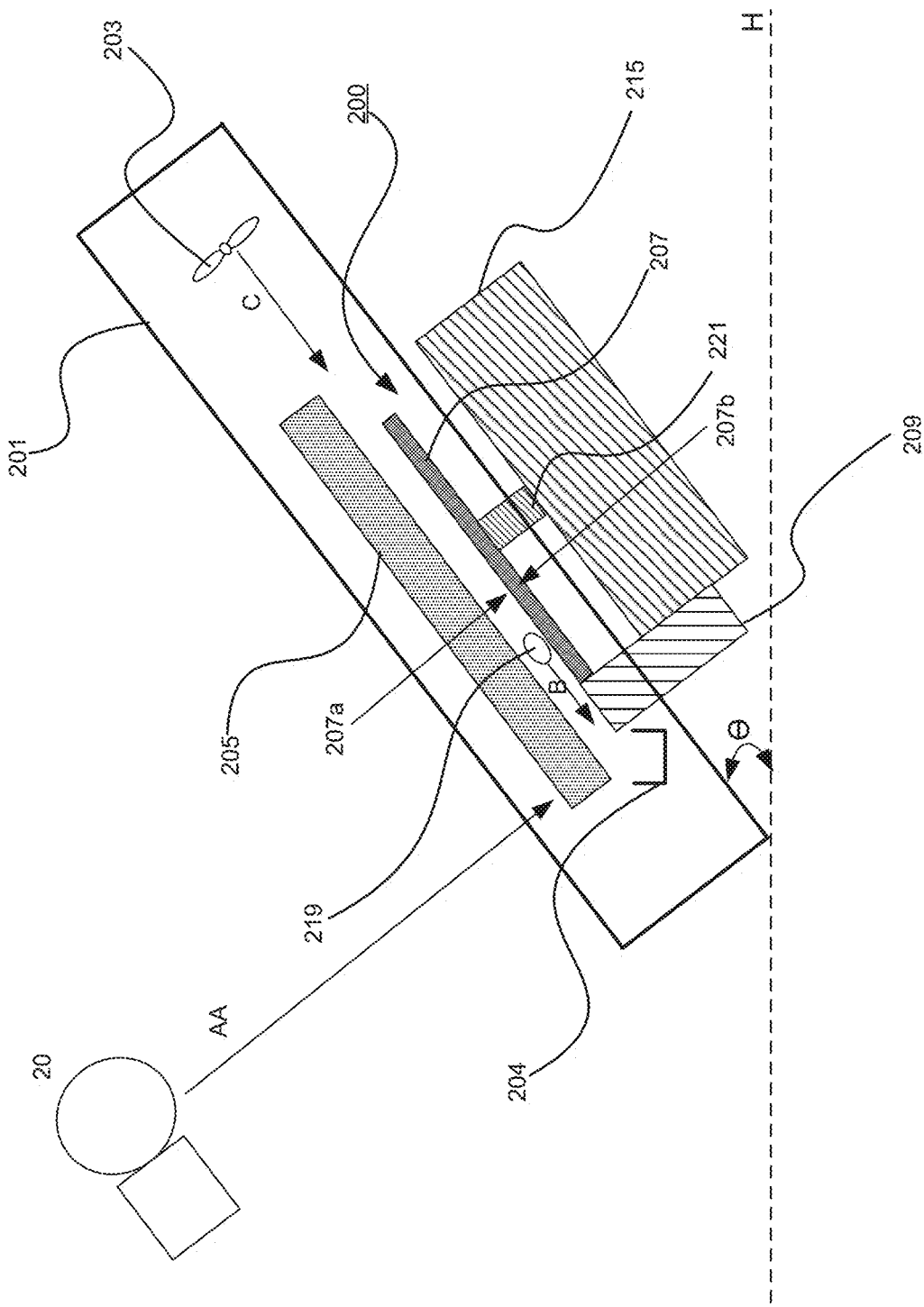
FIG. 2A is a schematic diagram illustrating an apparatus in accordance with embodiments of the present disclosure.

FIG. 2A is a schematic diagram illustrating an apparatus 200 in accordance with embodiments of the present disclosure. As shown in FIG. 2A, the apparatus 200 is positioned inside a case 201. The case 201 is configured to accommodate an electronic component 205 (e.g., a motion sensor, a display, a touch panel, a signal receiver, etc.). The case 201 can be positioned to form an angle θ relative to a horizontal plane H. The case 201 is positioned such that a user 20 can interact with (e.g., view, observe, instruct instruction to, or receive signal from) the electronic component 205 in direction AA. As shown, the apparatus 200 is positioned opposite to the electronic component 205 and configured to adjust an environmental condition (e.g., temperature, humidity, etc.) in the case 201.

A fan 203 is positioned in the case 201 to facilitate ventilation or air circulation inside the case 201. A fluid collector 204 is positioned in the case 201 and opposite to the fan 203. The fluid collector 204 is configured to receive collected water drop 219 formed on a surface of the apparatus 200 (to be discussed in detail below). For example, the collected water drop 219 can move in direction B toward the fluid collector 204 (e.g., by gravity). The fan 203 can generate airflow in direction C to facilitate the movement of the collected water drop 219 toward the fluid collector 204. Once the fluid container 204 is full, the fluid therein can be drained out from the case 201. The apparatus 200 includes a thermal control unit (TCU) 207, a moisture transfer component 209 coupled to the TCU 207, a heat exchanger 215 coupled to the moisture transfer component 209, and a heat conductor 221 positioned between the TCU 207 and the heat exchanger 215. The TCU 207 is configured to adjust the environmental condition by heating or cooling the air in the case 201. The TCU 207 has a first side 207*a* configured to cool the air nearby and a second side 207*b* configured to heat the air nearby. Without be bound by theory, the temperature difference created by the first sides 207*a*, 207*b* can result in airflow or turbulence inside the case 201 that can facilitate removing moisture carried by the air inside the case 201 (e.g., by moving more moisture close to the first side 207*a*).

The heat conductor 221 is configured to transfer heat from the second side 207*b* of the TCU to the heat exchanger 215 positioned outside the case 201. In some embodiments, the heat exchanger 215 can include multiple heat exchanger fins or plates. As shown in FIG. 2A, the heat exchanger 215 is coupled to and is configured to heat the moisture transfer component 209.

When the first side 207*a* of the TCU 207 cools the air, the collected water drop 219 is formed thereon. The collected water drop 219 then moves in direction B. The moisture transfer component 209 then receives a portion (if not all) of the collected water drop 219. The received water drop 219 can then be transferred to the outside of the case 201 and be evaporated by the heat from the heat exchanger 215. The rest of the collected water drop 219, if any, then moves to the fluid collector 204, which can be later drained out from the case 201.

In some embodiments, the case 201 can be moved or rotated such that the angle θ can change accordingly. In such embodiments, the larger the angle θ is, the faster the collected water drop 219 being moved toward the fluid container 204.

FIG. 2B is a schematic diagram illustrating the apparatus 200 in accordance with embodiments of the present disclosure. As shown in FIG. 2B, the fan 203 can be positioned on a side of the case 201 and the apparatus 200 can be positioned on another side of the case 201. The apparatus 200 is configured to remove moisture inside the case 201 to the outside of the case 201 (e.g., in direction W as shown). The fan 203 is configured to generate an airflow flowing inside the case 201 to enhance the efficiency of the moisture removal performed by the apparatus 200. The apparatus 200, the case 201, and the fan 203 can be shaped and sized based on the shape/size of a component (e.g., the electronic component 205) to be positioned in the case 201. The apparatus 200, the case 201, and the fan 203 can be modular components for easy and quick installation, replacement, and maintenance.

Figure 3:
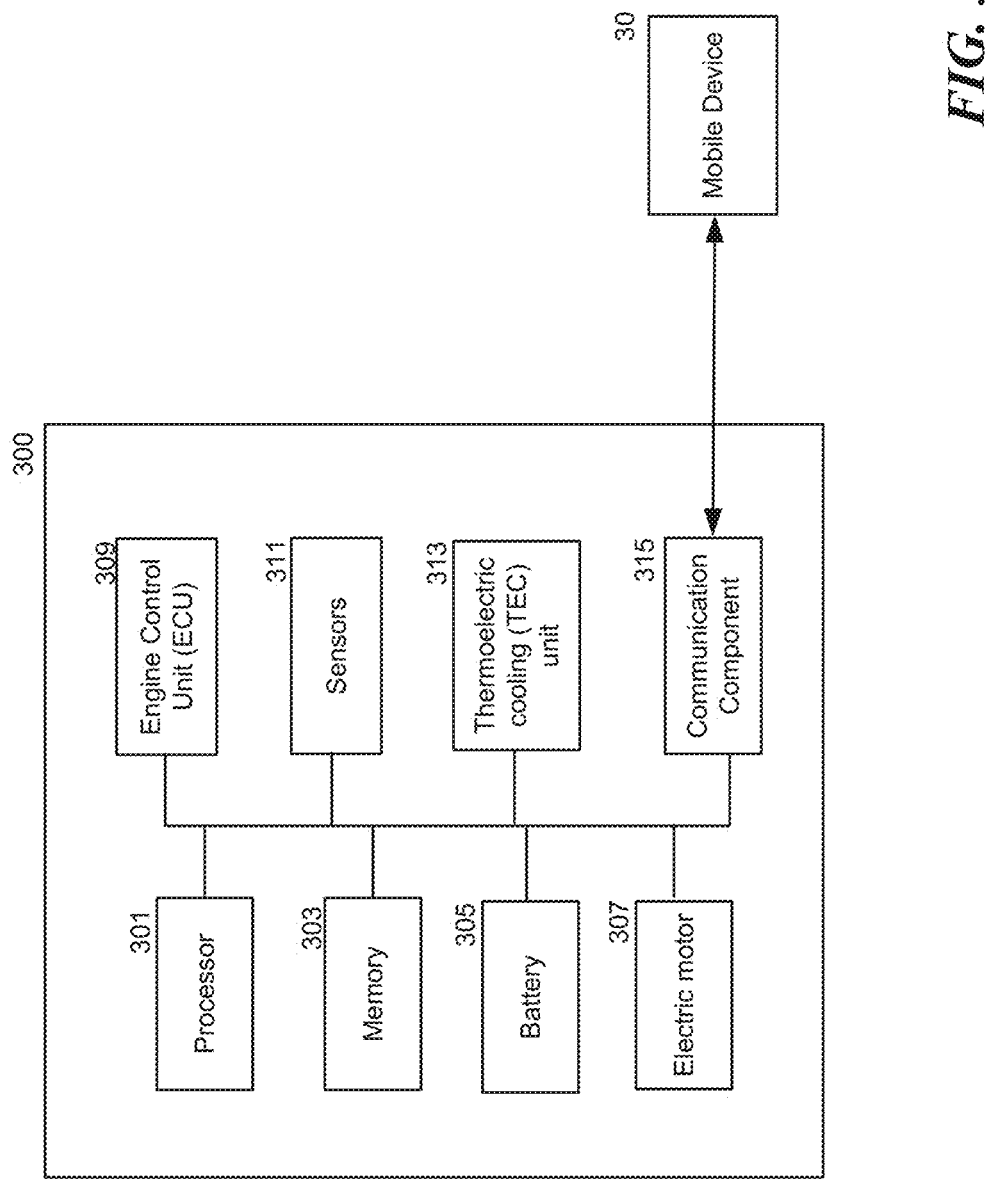
FIG. 3 is a block diagram illustrating a system in accordance with embodiments of the present disclosure.

FIG. 3 is a block diagram illustrating a system 300 in accordance with embodiments of the present disclosure. In some embodiments, the system 300 can be implemented as an electric vehicle or an electric scooter. The system 300 includes a processor 301, a memory 303, a battery 305, an electric motor 307, an engine control unit (ECU) 309, one or more sensors 311, a thermoelectric cooling (TEC) unit 313, and a communication component 315. The processor 301 (e.g., a central processing unit, CPU) is configured to control other components of the system 300 and to execute instructions to perform desired operations. The memory 303 is coupled to the processor 301 and is configured to store instructions for controlling other components or other information in the system 300. The battery 305 is configured to power the electric motor 307 such that the electric motor 307 can move the system 300. The ECU 309 is configured to control the electric motor 307. The communication component 315 is configured to communicate with other devices (e.g., a mobile device 30).

The sensor 311 is configured to sense one or more environmental values (e.g., temperature, humidity, air pressure, brightness, air quality, etc.) of the system 300. In some embodiments, the sensor 311 can include multiple sensors. In some embodiments, the sensor 311 can include a transducer that converts measured information into signals in electrical form. The TEC unit 313 is coupled to the processor 301 and the sensors 311. The processor 301 receives signals regarding the environmental values measured by the sensor 311. The processor 301 then analyzes the environmental values (e.g., compare them with predetermined threshold values). Based on the result of the analysis, the processor 301 can accordingly instruct the TEC unit 313 to adjust the environmental value of the system 300.

For example, the processor 301 can instruct the TEC unit 313 to increase/decrease the temperature of the system 300. As another example, the processor 301 can instruct the TEC unit 313 to increase/decrease the humidity of the system 300. In some embodiments, the TEC unit 313 can be arranged/positioned in the ways similar to those of the TEC unit 107 and/or the TCU 207 discussed above.

In some embodiments, the processor 301 can receive information from the ECU 309 and then control the TEC unit 313 accordingly based on the received information. In some embodiments, the processor 301 and the ECU 309 can be implemented as a system on a chip (SoC). In some embodiments, the processor 301 can be included in the ECU 309. In some embodiments, a user can instruct the TEC unit 313 to adjust the environmental value via the mobile device 30. In some embodiments, the system 300 can transmit the measured environmental value to the mobile device 30.

Figure 4:
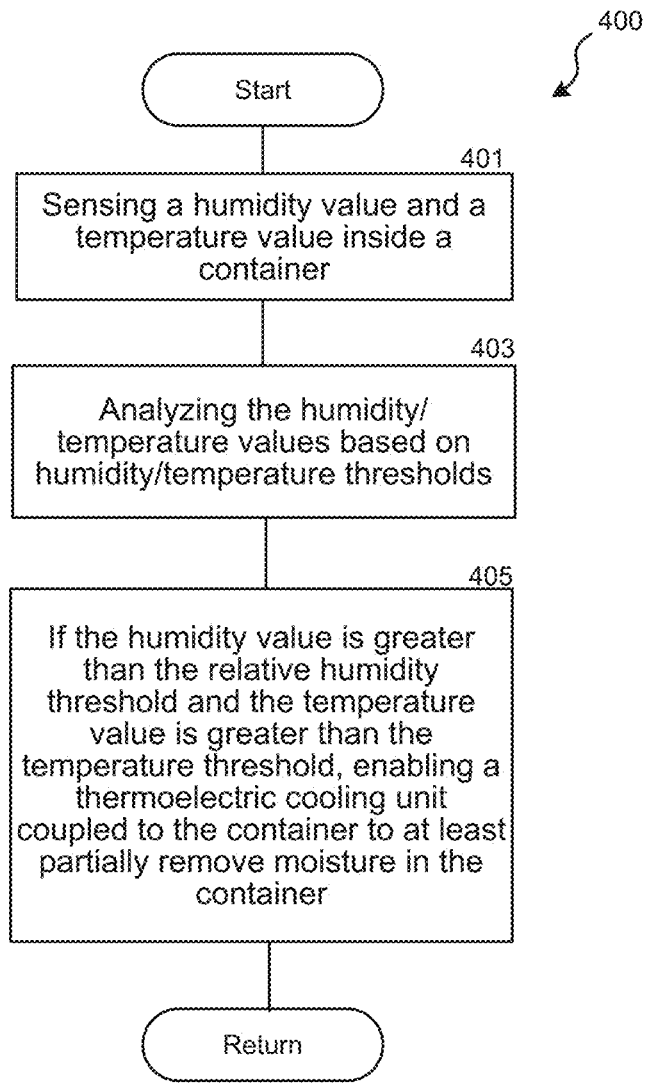
FIG. 4 is a flow diagram showing a method in accordance with embodiments of the present disclosure.

FIG. 4 is a flow diagram showing a method 400 in accordance with embodiments of the present disclosure. The method 400 is used for controlling the humidity inside a container (e.g., a dashboard container) configured to accommodate a display. In some embodiments, the method 400 can be performed by the apparatuses 100, 200 and the system 300 discussed above. The method 400 starts at block 401 by sensing a humidity value and a temperature value inside the container.

At block 403, the method 400 continues by analyzing the humidity value based on a humidity threshold and by analyzing the temperature value based on a temperature threshold. At block 405, if the humidity value is greater than the relative humidity threshold (e.g., 50%) and the temperature value is greater than the temperature threshold (e.g., 25 degrees Celsius), the method 400 then enables a thermoelectric cooling unit (e.g., the TEC units 107, 307, or the TCU 207 discussed above) coupled to the container to at least partially remove the moisture in the container. In such situation, without be bound by theory, because the sensed temperature and humidity are both high, initiating a moisture removal process can make sure that the display in the container can function properly.

In some embodiments, if the sensed humidity value is greater than the relative humidity threshold and the temperature value is smaller than the temperature threshold, the method 400 can include instructing the TEC unit to increase the temperature. In such situation, without be bound by theory, when the sensed temperature is low whereas the sensed humidity is high, it is easy for the moisture in the air to condense on a surface of a display, thereby causing a "foggy" display. Therefore, increasing the temperature inside the container can mitigate this foggy display situation.

In some embodiments, when the sensed humidity value is smaller than the relative humidity threshold and the temperature value is greater than the temperature threshold, the method 400 can include instructing the TEC unit to decrease the temperature inside the container. In such situation, without be bound by theory, when the sensed temperature is high whereas the sensed humidity is low, it is easy for the moisture in the air to condense on a surface of a display, which may also result in the foggy display situation. Decreasing the temperature can also mitigate this foggy display situation.

In some embodiments, if the sensed humidity value is smaller than the relative humidity threshold and the temperature value is smaller than the temperature threshold, the method 400 can include increasing the temperature (e.g., to a room temperature). In such situation, without be bound by theory, when the sensed temperature is low whereas the sensed humidity is low, it is relatively difficult to have the foggy display situation described above. However, to maintain a proper temperature for the display to operate, the method 400 can include instructing the TEC unit to increase the temperature to the room temperature.

The method 400 can include heating the capillary unit (e.g., the portion that is positioned outside the container) to evaporate the removed moisture by the thermoelectric cooling unit. In some embodiments, a heating side/surface of the TCU can be directly coupled to the capillary unit such that the TCU can heat the capillary unit. In other embodiments, the TCU can be coupled to the capillary unit via a heat sink or heat transfer component. The heat sink can be formed in accordance with the shape of the TCU or the container.

In some embodiments, the method 400 can include setting a temperature of a cooling side of the TCU to be about 5-30° C. In some embodiments, the humidity threshold can be set as a relative humidity of 30-70%. In some embodiments, the present technology can determine the location of the container and then provide recommendations regarding setting the temperature and humidity thresholds. In some embodiments, the present technology can provide recommendations based on the type of devices (e.g., a vehicle, a scooter, etc.) that the container is coupled with.

In some embodiments, the present technology can set a combination of threshold values and then implement them. For example, the present technology can first decrease the temperature (e.g., to 5-10° C. to remove moisture in the air in the container) and then increase the temperature to a working temperature (e.g., 30-50° C.) that suits for an electronic component (e.g., an LED/LCD display) positioned in the container.

In some embodiments, the method 400 can repeat steps 401 and 403 until the criteria described in block 405 is met. In some embodiments, the method 400 can perform steps 401 and 403 at predefined time intervals (e.g., 10 second, 1 minute, 15 minutes, etc.).

FIG. 5 is a reference table showing the relationship between dew point temperature and relative humidity. The present technology can determine the temperature threshold and the humidity threshold based on the relationship described in FIG. 5. For example, if a measured relative humidity value is greater than 50% and a measured temperature value is greater than the 25° C., it indicates that the container has a relative high humidity and a relative high temperature, which may result in a "foggy" surface or mist drops formed on the surface of a container. To mitigate the foggy surface situation, the present technology can set the temperature of the TCU as 7° C. for condensing moisture in the air inside the container so as to decrease the relative humidity therein. As shown in FIG. 5, the relative humidity at 42.84% corresponds to the dew point temperature at 7° C. Accordingly, setting the TCU temperature as 7° C. will facilitate adjusting the humidity inside the container to 42.84%. In other embodiments, the present technology can adjust humidity by setting the temperature of the TCU based on the relationship described in FIG. 5.

The present technology also provides a customized, component-specific approach to control the temperature and humidity in a container. For example, to maintain a proper operation of a display component in the container, the present technology can set the temperature of the TCU at a room temperature (e.g., 25° C.) or at a working temperature (e.g., 40° C., depending on the types of components positioned in the container). In some embodiments, the present technology also enables a user to set a target humidity or other suitable environmental conditions.

Figure 6:
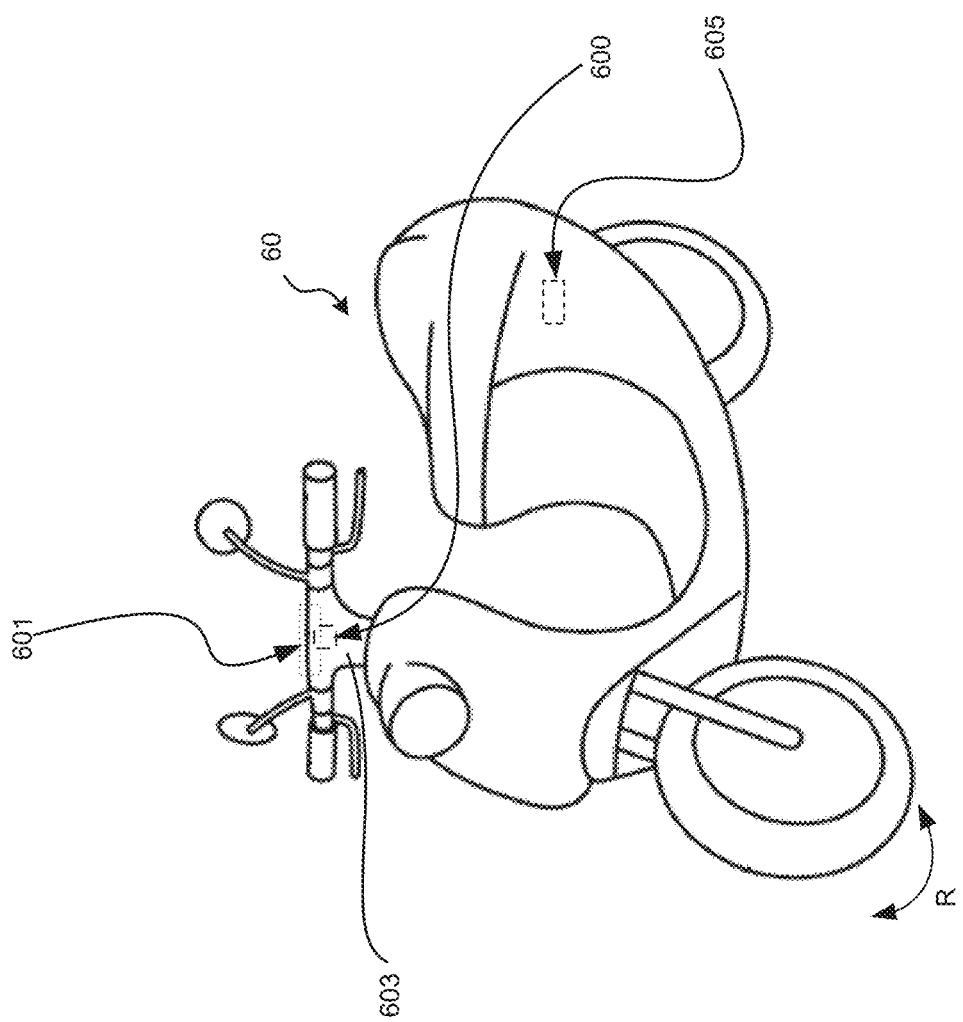
FIG. 6 is a schematic diagram illustrating a system in accordance with embodiments of the present disclosure.

FIG. 6 is a schematic diagram illustrating a system 600 in accordance with embodiments of the present disclosure. The system 600 is configured to control the temperature of a dashboard component 601 of a vehicle 60. The system 600 can include components similar to those in the system 300 discussed above. As shown in FIG. 6, the vehicle 60 includes a handle bar structure 603 configured to steer or handle the vehicle 60 (e.g., in direction R as indicated in FIG. 6) and an ECU 605 configured to control components of the vehicle and communicate with the system 600. As shown, the dashboard component 601 can be positioned in the handle bar structure 603 and is configured to present (e.g., display) information to an operator. The system 600 can facilitate the operation of the dashboard component 601 by adjusting the temperature and humidity therein. In some embodiments, the ECU 605 can communicate with the system 600 and then control the same. For example, the system 600 can include a sensor and a thermoelectric cooling unit. The ECU 605 can communicate with the sensor and then receive humidity/temperature information (e.g., the humidity/temperature in the system 600 measured by the sensor) therefrom. In response to the received humidity/temperature information, the ECU 605 can accordingly instruct the thermoelectric cooling unit to adjust the humidity/temperature in the system 600.

In some embodiments, the operator can position the dashboard component 601 and the system 600 at an angle (e.g., angle θ shown in FIG. 2A) relative to the horizontal plane. By so doing, the operator can facilitate the system 600 to drain out collected moisture in the dashboard component 601 by operating the vehicle 60. For example, rotating the handle bar structure 603 can result in moving the collected moisture toward a side of the handle bar structure 603 where the collected moisture can be drained out.

While the present technology has been described in terms of what are presently considered the most practical and preferred embodiments, it is to be understood that the present technology need not be restricted to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present technology defined by the appended claims.

The invention claimed is:

1. An apparatus for controlling an environmental condition inside a housing, comprising:
   a thermoelectric cooling unit comprising a first side facing away from an inner surface of the housing and a second side facing the inner surface of the housing;
   a capillary unit comprising a first part and a second part, wherein the first part and the second part are integrally formed, and wherein the first part is coupled to the thermoelectric cooling unit and is positioned inside the housing, and wherein the second part is positioned outside the housing;
   a sensor positioned inside the housing and configured to sense a humidity value and a temperature value inside the housing; and
   a controller configured to communicate with the sensor and the thermoelectric cooling unit, wherein the controller receives information regarding the humidity value and the temperature value from the sensor; and
   wherein the housing has a cover, and wherein the cover of the housing is positioned to form an acute angle relative to a horizontal plane;
   wherein the thermoelectric cooling unit is positioned in alignment with the cover so as to facilitate the thermoelectric cooling unit removing the moisture in the housing,
   wherein in an event that the humidity value is greater than a humidity threshold and the temperature value is greater than a temperature threshold, the controller is configured to control the thermoelectric cooling unit to remove moisture in the housing, and wherein the first part of the capillary unit collects the removed moisture and transmits the removed moisture to the second part of the capillary unit, and wherein the humidity threshold is a relative humidity of 50%.

2. The apparatus of claim 1, wherein the controller sets a target temperature of the first side of the thermoelectric cooling unit to be 7° C.

3. The apparatus of claim 1, further comprising a heat sink coupled to the second side of the thermoelectric cooling unit, wherein the second part of the capillary unit is coupled to the heat sink, and wherein the controller enables the thermoelectric cooling unit to heat the second part of the capillary unit to evaporate liquid inside the second part of the capillary unit.

4. The apparatus of claim 3, wherein the apparatus further comprises a heat conductor positioned between the thermoelectric cooling unit and the heat sink.

5. The apparatus of claim 1, further comprising a U-shaped structure coupled to the first side of the thermoelectric cooling unit, wherein the U-shaped structure is coupled to the first part of the capillary unit.

6. The apparatus of claim 5, wherein the U-shaped structure includes a sloped-shape, and wherein the first part of the capillary unit is in contact with a side portion of the U-shaped structure.

7. The apparatus of claim 1, further comprising a funnel-shaped structure coupled to the first side of the thermoelectric cooling unit, wherein the funnel-shaped structure is coupled to the first part of the capillary unit.

8. An apparatus for controlling an environmental condition inside a housing, comprising:
   a thermoelectric cooling unit comprising a first side facing away from an inner surface of the housing and a second side facing the inner surface of the housing;
   a capillary unit comprising a first part and a second part, wherein the first part and the second part are integrally formed, and wherein the first part is coupled to the thermoelectric cooling unit and is positioned inside the housing, and wherein the second part is positioned outside the housing;
   a sensor positioned inside the housing and configured to sense a humidity value and a temperature value inside the housing; and
   a controller configured to communicate with the sensor and the thermoelectric cooling unit, wherein the controller receives information regarding the humidity value and the temperature value from the sensor; and wherein the housing has a cover, and wherein the cover of the housing is positioned to form an acute angle relative to a horizontal plane;

wherein the thermoelectric cooling unit is positioned in alignment with the cover so as to facilitate the thermoelectric cooling unit removing the moisture in the housing, wherein in an event that the humidity value is greater than a humidity threshold and the temperature value is greater than a temperature threshold, the controller is configured to control the thermoelectric cooling unit to remove moisture in the housing, and wherein the first part of the capillary unit collects the removed moisture and transmits the removed moisture to the second part of the capillary unit, and wherein the temperature threshold is 25° C.

9. An apparatus for controlling an environmental condition inside a housing, comprising:
a thermoelectric cooling unit comprising a first side facing away from an inner surface of the housing and a second side facing the inner surface of the housing;
a capillary unit comprising a first part and a second part, wherein the first part and the second part are integrally formed, and wherein the first part is coupled to the thermoelectric cooling unit and is positioned inside the housing, and wherein the second part is positioned outside the housing;
a sensor positioned inside the housing and configured to sense a humidity value and a temperature value inside the housing; and
a controller configured to communicate with the sensor and the thermoelectric cooling unit, wherein the controller receives information regarding the humidity value and the temperature value from the sensor; and
wherein the housing has a cover, and wherein the cover of the housing is positioned to form an acute angle relative to a horizontal plane;
wherein the thermoelectric cooling unit is positioned in alignment with the cover so as to facilitate the thermoelectric cooling unit removing the moisture in the housing,
wherein in an event that the humidity value is greater than a humidity threshold and the temperature value is less than a temperature threshold, the controller is configured to set a target temperature of the first side of the thermoelectric cooling unit to be the temperature threshold.

10. An apparatus for controlling an environmental condition inside a housing, comprising:
a thermoelectric cooling unit comprising a first side facing away from an inner surface of the housing and a second side facing the inner surface of the housing;
a capillary unit comprising a first part and a second part, wherein the first part and the second part are integrally formed, and wherein the first part is coupled to the thermoelectric cooling unit and is positioned inside the housing, and wherein the second part is positioned outside the housing;
a sensor positioned inside the housing and configured to sense a humidity value and a temperature value inside the housing; and
a controller configured to communicate with the sensor and the thermoelectric cooling unit, wherein the controller receives information regarding the humidity value and the temperature value from the sensor; and wherein the housing has a cover, and wherein the cover of the housing is positioned to form an acute angle relative to a horizontal plane;

wherein the thermoelectric cooling unit is positioned in alignment with the cover so as to facilitate the thermoelectric cooling unit removing the moisture in the housing, wherein in an event that the relative humidity value is equal to or less than a humidity threshold and the temperature value is less than a temperature threshold, the controller is configured to set a target temperature of the first side of the thermoelectric cooling unit to be the temperature threshold.

11. An apparatus for controlling an environmental condition inside a housing, comprising:
a thermoelectric cooling unit comprising a first side facing away from an inner surface of the housing and a second side facing the inner surface of the housing;
a capillary unit comprising a first part and a second part, wherein the first part and the second part are integrally formed, and wherein the first part is coupled to the thermoelectric cooling unit and is positioned inside the housing, and wherein the second part is positioned outside the housing;
a sensor positioned inside the housing and configured to sense a humidity value and a temperature value inside the housing; and
a controller configured to communicate with the sensor and the thermoelectric cooling unit, wherein the controller receives information regarding the humidity value and the temperature value from the sensor; and
wherein the housing has a cover, and wherein the cover of the housing is positioned to form an acute angle relative to a horizontal plane;
wherein the thermoelectric cooling unit is positioned in alignment with the cover so as to facilitate the thermoelectric cooling unit removing the moisture in the housing,
wherein in an event that the humidity value is equal to or less than a humidity threshold and the temperature value is greater than a temperature threshold, the controller is configured to set a first target temperature of the first side of the thermoelectric cooling unit to be the temperature threshold, and wherein the controller sets a second target temperature inside the housing to be a second temperature value different from the temperature value.

12. A method for controlling humidity inside a container configured to accommodate a display, the method comprising:
sensing a humidity value and a temperature value inside the container;
analyzing the humidity value based on a humidity threshold; and
analyzing the temperature value based on a temperature threshold;
in an event that the humidity value is greater than the relative humidity threshold and the temperature value is greater than the temperature threshold, controlling a thermoelectric cooling unit coupled to the container to at least partially remove moisture in the container,
wherein the thermoelectric cooling unit includes a first side facing away from an inner surface of the container, and
wherein the first side of the thermoelectric cooling unit at least partially removes the moisture in the container, and wherein the thermoelectric cooling unit is coupled to a capillary unit, and wherein the capillary unit includes a first part to collect the removed moisture and transmit the removed moisture to a second part of the capillary unit, wherein the container includes a cover for viewing the display, and wherein the cover of the container is configured to form an acute angle relative to a horizontal plane, and wherein the thermoelectric cooling unit is positioned in alignment with the cover so as to facilitate the thermoelectric cooling unit removing the moisture in the container.

13. The method of claim 12, further comprising heating the second part of the capillary unit to evaporate the removed moisture by the thermoelectric cooling unit, wherein the thermoelectric cooling unit includes a second side facing the inner surface of the container, and wherein the second side of the thermoelectric cooling unit is coupled to the second part of the capillary unit via a heat sink.

14. The method of claim 12, wherein the thermoelectric cooling unit is parallel to the cover.

\* \* \* \* \*